United States Patent
Meguro

(10) Patent No.: US 6,657,251 B1
(45) Date of Patent: Dec. 2, 2003

(54) SEMICONDUCTOR MEMORY DEVICE HAVING MEMORY TRANSISTORS WITH GATE ELECTRODES OF A DOUBLE-LAYER STACKED STRUCTURE AND METHOD OF FABRICATING THE SAME

(75) Inventor: Hisataka Meguro, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/524,754

(22) Filed: Mar. 14, 2000

(30) Foreign Application Priority Data

Mar. 15, 1999 (JP) .............................. 11-067823

(51) Int. Cl.⁷ .......................... H01L 29/76; H01L 29/788
(52) U.S. Cl. ........................................ 257/316; 257/314
(58) Field of Search .................................. 257/314–324; 438/257–265

(56) References Cited

U.S. PATENT DOCUMENTS 5,880,498 A   3/1999  Kinoshita et al.
6,162,683 A * 12/2000  Chen ........................ 438/258

FOREIGN PATENT DOCUMENTS

| JP | 7-254652    |   | 10/1995 |
| JP | 9-64209     |   | 3/1997  |
| JP | 10-256402   |   | 3/1997  |
| JP | 409-321157 A| * | 12/1997 |
| JP | 09-064209   |   | 9/1998  |
| JP | 11-026731 A | * | 1/1999  |

* cited by examiner

Primary Examiner—Cuong Quang Nguyen
(74) Attorney, Agent, or Firm—Finnegan, Henderson, Farabow, Garrett & Dunner, L.L.P.

(57) ABSTRACT

A semiconductor memory device has gate electrodes which are formed on a gate insulating film in direct contact therewith and have nitrogen-doped regions on their sides, or gate electrodes which use a nitrogen-doped polysilicon film. The widthwise end portions of the gate electrodes are located outward of the associated end portion of a semiconductor substrate under the gate electrodes and extend over device isolation regions. This structure can suppress a variation in the threshold voltages of memory cells when the semiconductor memory device operates. It is therefore possible to provide a highly reliable nonvolatile semiconductor memory device.

20 Claims, 8 Drawing Sheets

SEMICONDUCTOR MEMORY DEVICE HAVING MEMORY TRANSISTORS WITH GATE ELECTRODES OF A DOUBLE-LAYER STACKED STRUCTURE AND METHOD OF FABRICATING THE SAME

CROSS-REFERENCE TO RELATED APPLICATION

This application is based upon and claims the benefit of priority from the prior Japanese Patent Application No. 11-067823, filed Mar. 15, 1999, the entire contents of which are incorporated herein by reference.

BACKGROUND OF THE INVENTION

The present invention relates to a semiconductor memory device, and, more particularly, to a memory cell array structure of a nonvolatile semiconductor memory which has memory transistors with gate electrodes of a double-layer stacked structure and a method of fabricating the same. Those semiconductor memory device and method are adapted to a NAND type EEPROM (Electrically Erasable and Programmable ROM).

A conventional method of fabricating memory cells will be described below referring to FIGS. 1A through 1G.

A gate oxide film 101 of $SiO_2$ is formed 8 nm thick on the flat-finished major surface of a substrate 100 of, for example, p type silicon, and a first conductive polycrystalline silicon film 102 is formed 100 nm thick on this gate oxide film 101. Then is formed a silicon nitride film (SiN) 103 with a thickness of 150 nm as an etching mask to remove the first polycrystalline silicon film 102 (FIG. 1A).

Next, a photoresist is coated on the entire surface of the silicon nitride film 103 and is then processed by photolithography, thus forming a resist pattern 104. With the resist pattern 104 as a mask, the silicon nitride film 103 is patterned to be an etching mask by anisotropic dry etching such as RIE (Reactive Ion Etching) (FIG. 1B).

Then, the resist pattern 104 is removed by wet etching. Next, with the patterned silicon nitride film 103 used as a mask, the first polycrystalline silicon film 102, the gate oxide film 101 and the semiconductor substrate 100 are selectively etched to a desired depth by anisotropic dry etching. This forms trenches 105 that surround device regions (FIG. 1C).

Then, a post-RIE oxide film 106 is formed 10 nm thick in order to recover from the damages on the etched side of the gate oxide film 101 and the etched surface of the semiconductor substrate 100 (FIG. 1D).

Next, a buried insulating film 107 of $SiO_2$ or the like is formed 600 nm thick on the entire surface of the semiconductor substrate 100 to bury the trenches 105 between the first polycrystalline silicon film 102. The buried insulating film 107 is then planarized to the desired height by CMP (Chemical Mechanical Polishing), thus exposing the silicon nitride film 103 (FIG. 1E).

Thereafter, the silicon nitride film 103 is removed by wet etching, forming device isolation regions comprising the buried insulating film 107 (FIG. 1F).

Then, an ONO film ($SiO_2$—SiN—$SiO_2$) 108 is deposited 12 nm thick on the entire surfaces of the first polycrystalline silicon film 102 and the buried insulating film 107. Thereafter, a second polycrystalline silicon film 109 and a high-melting-point or refractory metal silicide film 110 of Ti, W or the like are deposited in order on this ONO film 108 (FIG. 1G).

Thereafter, to form word lines (WL), the refractory metal silicide film 110, the second polycrystalline silicon film 109, the ONO film 108 and the first polycrystalline silicon film 102 are processed in order by anisotropic dry etching. Then, ion implantation is carried out to form source/drain regions in the semiconductor substrate 100 by which memory cells are completed.

In the case where a memory cell array whose electrodes have such a double-layer stacked structure is adapted to a nonvolatile semiconductor memory (e.g., EEPROM), if the post-RIE oxide film 106 is a thermal oxide film, the gate size varies depending on the oxidation rate. That is, as the oxidation rate of the first polycrystalline silicon film 102 is fast with respect to the semiconductor substrate 100, the edge portions of the electrodes are cut back from (come inside) the edge portions of the device regions (FIG. 1G).

In general, an EEPROM has a floating gate electrically isolated from the peripheral sections and stores data of "1" or "0" by injecting or discharging electrons into or from the floating gate. When a high electric field of about 10 MV/cm is applied to both ends of the silicon oxide film, a tunnel current of the order of $10^{-10}$ $A/\mu m^2$ flows. This current is called FN (Fowler-Nordheim) current.

Injection of electrons (writing) is implemented by applying a high voltage of 20V to a control gate (CG) and setting the source/drain region of the semiconductor substrate to 0V as shown in FIG. 2A. Under this situation, a floating gate (FG) has a high potential and a high electric field is applied to the gate oxide film, so that the FN current flows to the source/drain region from the floating gate (FG). As electrons travel in the opposite direction to that of the current, electrons are injected into the floating gate (FG).

In discharging (erasing) electrons from the floating gate (FG), as shown in FIG. 2B, 0V is applied to the control gate (CG) and 20V to the drain region. Under this situation, a high electric field is generated toward the floating gate (FG) from the drain region. As a result, the FN current flows to the floating gate (FG) from the drain region and electrons are discharged from the floating gate (FG).

As shown in FIG. 2C, a strong electric field is applied to the gate oxide film at the portion where the end portion of the floating gate on which the electric field concentrates in this operation faces the source/drain region, thereby damaging the gate oxide film.

Even in the write operation of the nonvolatile memory in FIG. 1G, electrons are injected into the first polycrystalline silicon film 102, so that the voltage of about 20V applied to the refractory metal silicide film 110 produces the FN current in the gate oxide film 101.

To discharge electrons from the first polycrystalline silicon film 102 in the erasing operation of the nonvolatile memory, a voltage of about 20V is applied to the semiconductor substrate 100. With the state-of-the-art technology, writing to memory cells block by block and simultaneous erasing, which respectively take several $\mu sec$ and several msec, are carried out to make writing and erasing faster.

As apparent from this, erasure takes longer time than writing. If the edge of each gate electrode is located on the semiconductor substrate 100 at an area equivalent to the cathode electrode in erase mode, an electric field concentrates on this area, causing the edge portion to have a higher current density than that of the flat surface as implied above referring to FIG. 2C.

The higher the current density of the FN current becomes, the larger the trap is formed in the gate oxide film. This leads to a variation in threshold voltage even at the stage of fewer writing and erasing cycles.

BRIEF SUMMARY OF THE INVENTION

Accordingly, it is an object of the present invention to provide a semiconductor memory device having a gate structure which prevents an electric field from concentrating on the widthwise edge portion of gate electrodes in order to reduce charges produced in an oxide film by electric stress, and a method of fabricating the same.

This invention provides memory cells having transistors which are so designed to prevent an electric field from concentrating on the widthwise edge portion of gate electrodes in order to reduce charges produced in an oxide film by electric stress. This structure can permit an electric field to be uniformly distributed over the gate electrodes and can thus contribute to fabricating stable memory transistors whose threshold voltage (Vth) has a less variation.

To achieve the above object, according to the first aspect of this invention, there is provided a semiconductor memory device comprising a semiconductor substrate having a major surface; a device region formed on the major surface of the semiconductor substrate; a device isolation region, formed by burying an insulating film in a trench formed in the major surface of the semiconductor substrate, for surrounding and defining the device region; a gate insulating film formed on the semiconductor substrate in the device region; and a first gate electrode formed on the gate insulating film in contact therewith, widthwise end portions of the first gate electrode extending at least over the device isolation region.

It is desirable that the first gate electrode is formed of polysilicon.

It is desirable to dope nitrogen atoms in those areas of the first gate electrode which extend at least over the device isolation region.

It is desirable that the first gate electrode is formed of polysilicon, and 3 to 5 wt % inclusive of nitrogen atoms are doped in those areas of the first gate electrode which extend at least over the device isolation region.

Nitrogen atoms may be doped in the first gate electrode almost evenly.

It is desirable that the first gate electrode is formed of polysilicon in which 3 to 5 wt % inclusive of nitrogen atoms are doped almost evenly.

The semiconductor memory device may further comprise a second gate electrode formed on the first gate electrode via an inter-electrode insulating film.

According to the second aspect of this invention, there is provided a method of fabricating a semiconductor memory device that comprises the steps of preparing a semiconductor substrate having a major surface on which device regions having source/drain regions formed therein and device isolation regions for defining the device regions are formed; depositing a gate insulating film, a polysilicon film and an inter-electrode insulating film in order on the major surface of the semiconductor substrate; patterning the polysilicon film into a plurality of first gate electrodes by etching the inter-electrode insulating film, the polysilicon film and the gate insulating film in a predetermined shape; forming trenches among the plurality of first gate electrodes by etching the major surface of the semiconductor substrate correspondingly to the device isolation regions; doping nitrogen atoms into exposed surfaces of the first gate electrodes; and performing a post oxidation treatment for recovery from damages in the trenches of the semiconductor substrate and on a side of the inter-electrode insulating film.

It is desirable that the step of doping nitrogen atoms into the exposed surfaces of the first gate electrodes includes a step of doping 3 to 5 wt % inclusive of nitrogen atoms.

According to the third aspect of this invention, there is provided a method of fabricating a semiconductor memory device that comprises the steps of preparing a semiconductor substrate having a major surface on which device regions having source/drain regions formed therein and device isolation regions for defining the device regions are formed; depositing a gate insulating film, a polysilicon film doped with nitrogen atoms and an inter-electrode insulating film in order on the major surface of the semiconductor substrate; patterning the polysilicon film into a plurality of first gate electrodes by etching the inter-electrode insulating film, the polysilicon film and the gate insulating film in a predetermined shape; forming trenches among the plurality of first gate electrodes by etching the major surface of the semiconductor substrate correspondingly to the device isolation regions; and performing a post oxidation treatment for recovery from damages in the trenches of the semiconductor substrate and on a side of the inter-electrode insulating film.

It is desirable that the step of forming the polysilicon doped with nitrogen atoms includes a step of doping 3 to 5 wt % inclusive of nitrogen atoms.

In the second and third aspects of this invention, the method may further comprise the step of forming second gate electrodes on the first gate electrodes via the inter-electrode insulating film.

According to this invention, a variation in the threshold voltage of memory cells in the operation of the device can be made smaller by providing nitrogen-doped regions on the sides of the gate electrodes or using a nitrogen-doped polysilicon film. It is therefore possible to provide a highly reliable nonvolatile semiconductor memory device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Preferred embodiments of the present invention will now be described with reference to the accompanying drawings.

First Embodiment

Figure 1A:
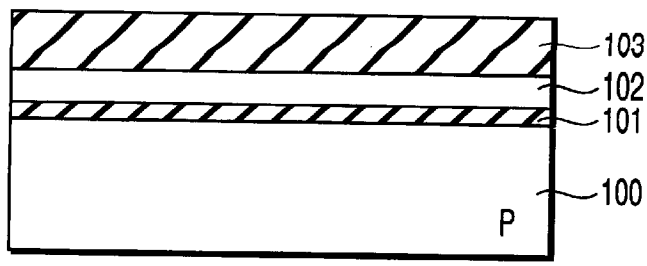
FIGS. 1A through 1G are cross-sectional views of memory cell portions showing the fabrication of the memory cells of a conventional EEPROM step by step.
Figure 1B:
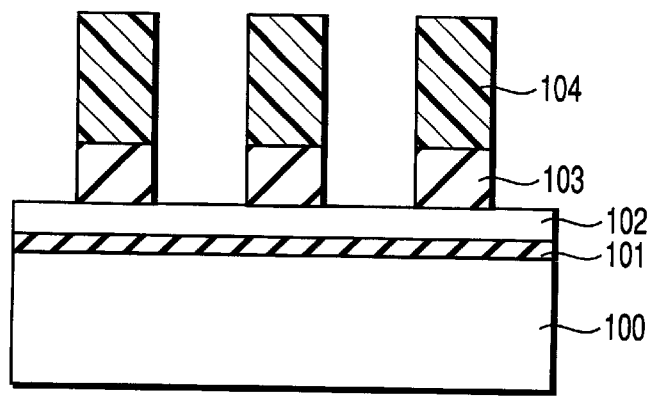
Figure 1C:
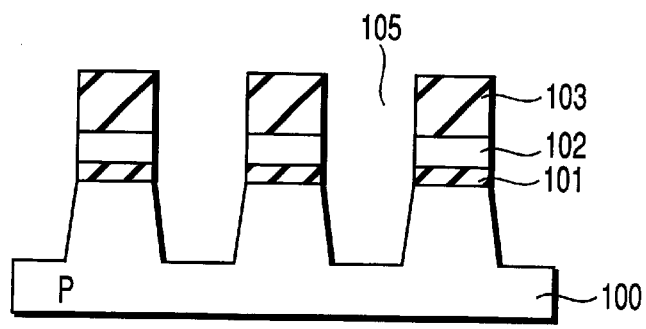
Figure 1D:
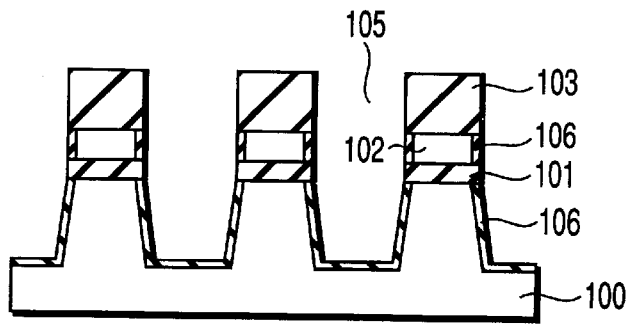
Figure 1E:
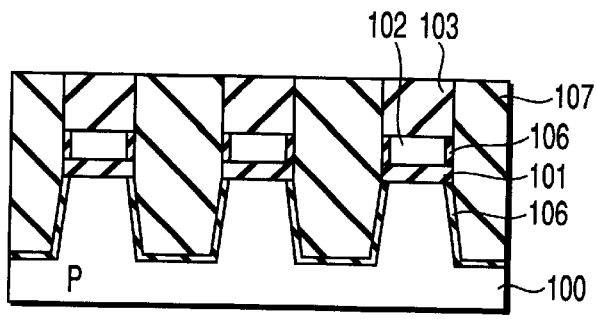
Figure 1F:
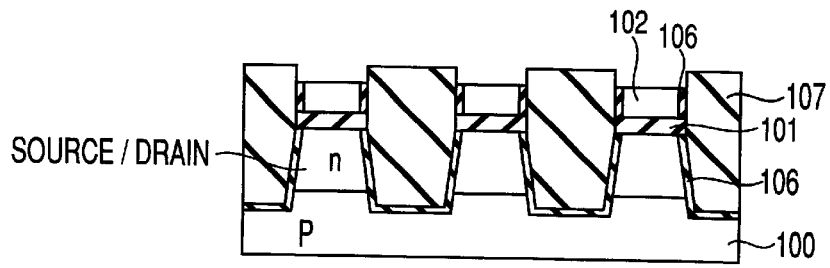
Figure 1G:
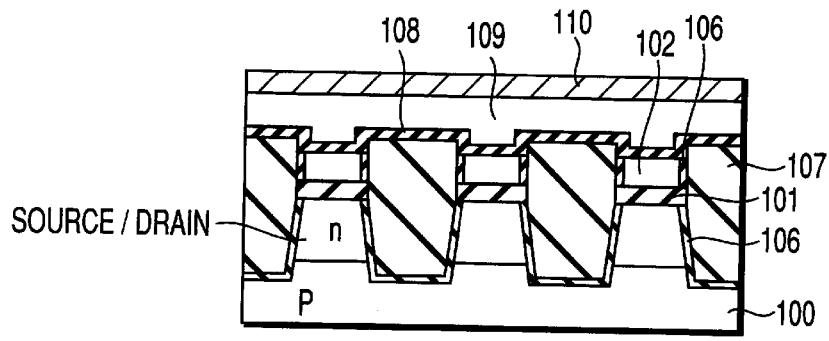
Figure 2A:
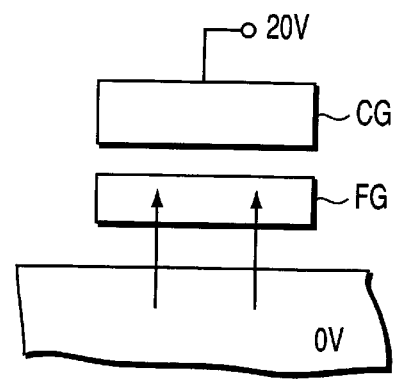
FIGS. 2A and 2B are exemplary cross-sectional views of a gate electrode portion illustrating the movements of electrons at the time of writing and erasing memory cells.
Figure 2B:
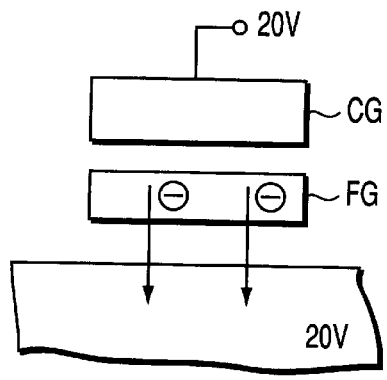
Figure 2C:
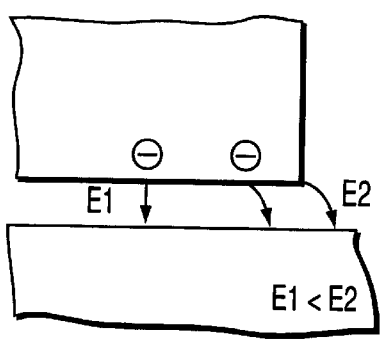
FIG. 2C is an exemplary cross-sectional view of a gate electrode portion illustrating an electric field state under the gate edge in case of FIG. 2B.
Figure 3A:
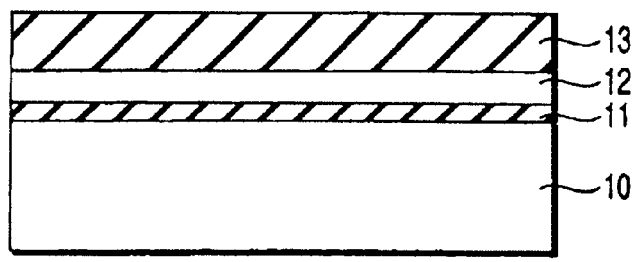
FIGS. 3A through 3H are cross-sectional views of memory cell portions showing the step-by-step fabrication of an EEPROM according to a first embodiment of this invention.
Figure 3B:
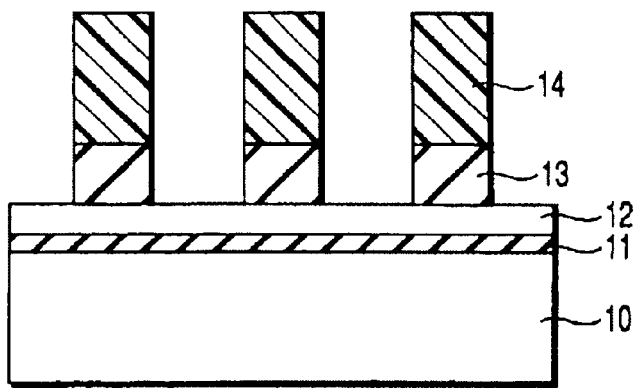
Figure 3C:
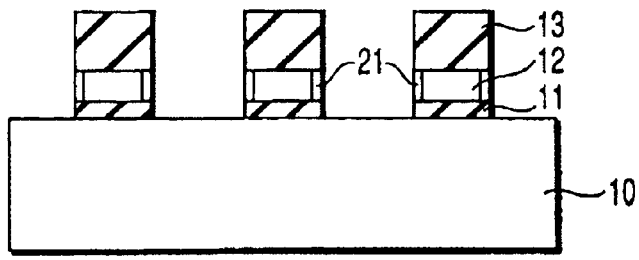
Figure 3D:
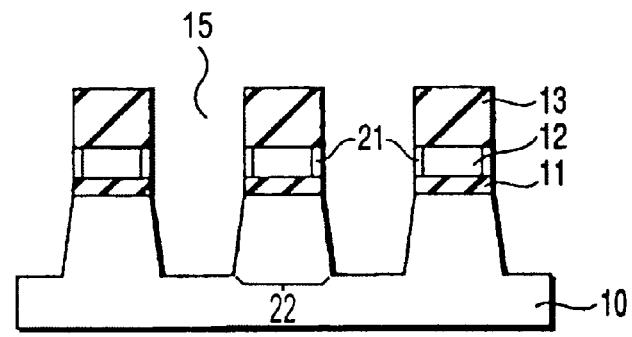
Figure 3E:
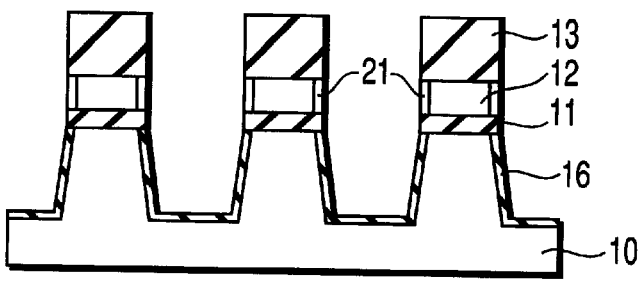
Figure 3F:
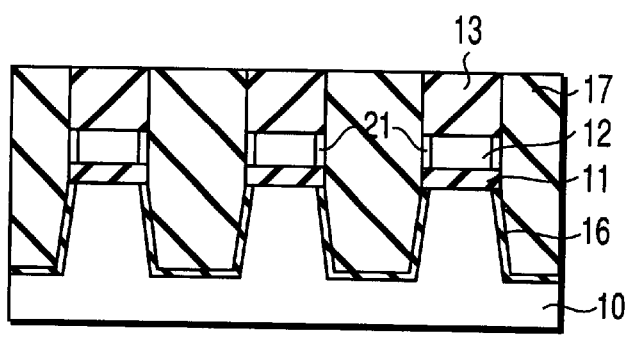
Figure 3G:
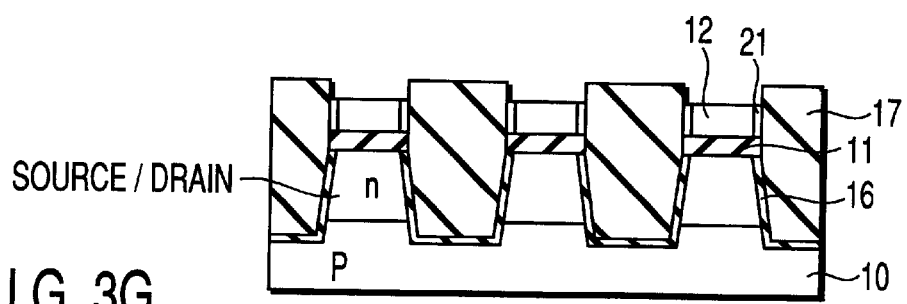
Figure 3H:
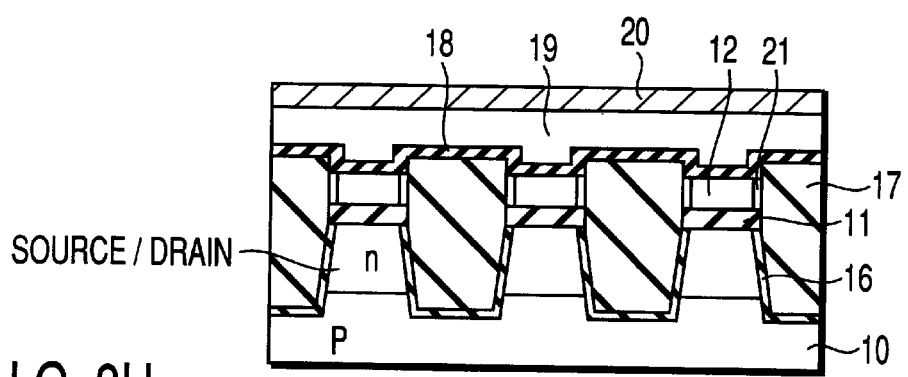
Figure 4:
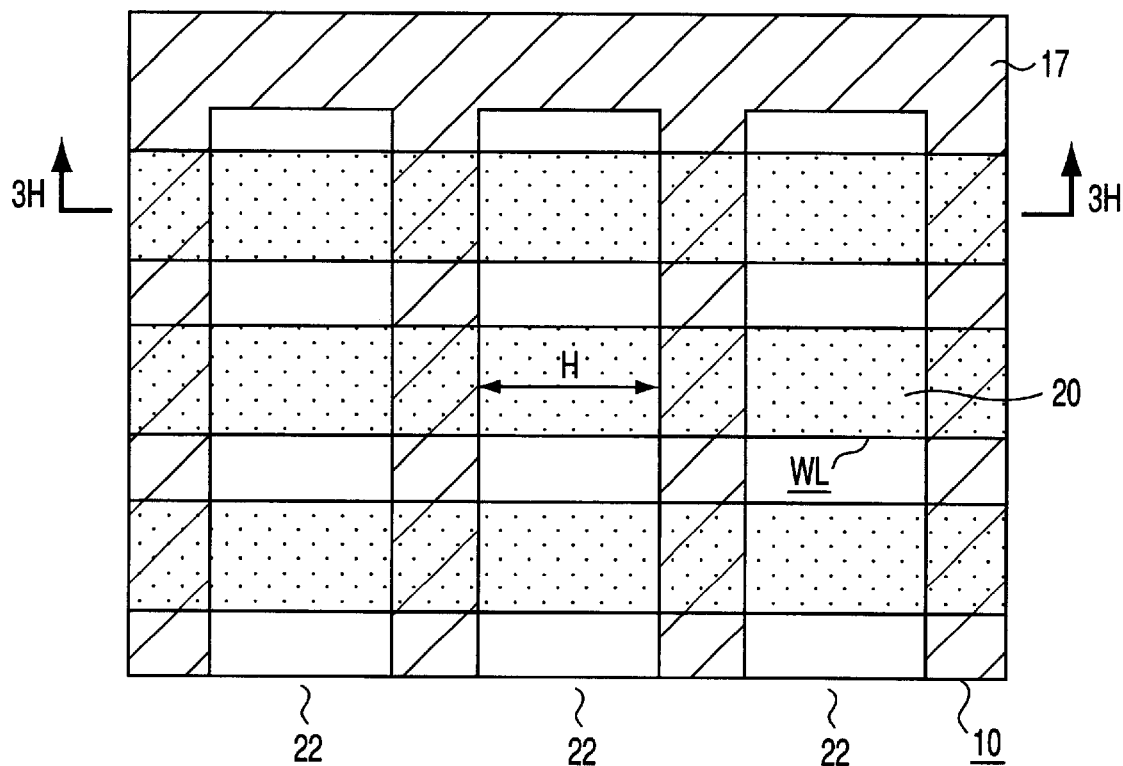
FIG. 4 is a plan view of the memory cell portions of the EEPROM of this invention.

FIGS. 3A through 3H are cross-sectional views of memory cell portions showing the step-by-step fabrication of an EEPROM, and FIG. 4 presents a plan view of the memory cell portions of the EEPROM. FIG. 3H shows a cross section along the line 3H—3H in FIG. 4.

A gate oxide film (insulating film) 11 of $SiO_2$ is formed 8 nm thick on the flat-finished major surface of a substrate 10 of, for example, p type silicon, and a first conductive polycrystalline silicon film 12 is formed 100 nm thick on this gate oxide film 11. Then is formed a silicon nitride film (SiN) 13 with a thickness of 150 nm used as an etching mask to remove the first polycrystalline silicon film 12 (FIG. 3A).

Next, a photoresist is coated on the entire surface of the silicon nitride film 13 and is then processed by photolithography, thus forming a resist pattern 14. With the resist pattern 14 as a mask, the silicon nitride film 13 is patterned to be an etching mask by anisotropic dry etching such as RIE (FIG. 3B).

Then, the resist pattern 14 is removed by wet etching, and the first polycrystalline silicon film 12 and the gate oxide film 11 are processed by anisotropic dry etching such as RIE by using the patterned silicon nitride film 13 as a mask.

Thereafter, thermal nitriding is carried out using an $NH_3$ gas, thereby forming a nitrogen-doped region 21 on the side of the first polycrystalline silicon film 12 (FIG. 3C). The proper amount of a nitrogen to be added to the polysilicon film is 3 to 5 wt % to the amount of the polysilicon film. Adding at least 3 wt % of nitrogen to the polysilicon film can remarkably lower the oxidation speed of the polysilicon film. As the amount of nitrogen added increases, however, the conductivity is reduced, the limit of addition is 5 wt %.

Thereafter, the semiconductor substrate 10 is selectively etched to a desired depth by anisotropic dry etching such as RIE, thereby forming trenches 15, and device regions 22 are formed in the regions that are defined by those trenches 15 (FIG. 3D).

Subsequently, a post-RIE oxide film 16 of $SiO_2$ is formed 10 nm thick in order to recover from the damages on the etched surface of the semiconductor substrate 10 (FIG. 3E). This oxide film 16 is integrated with a device-isolation insulating film to be buried layer and becomes part of the device-isolation insulating film.

Then, a buried insulating film 17 of $CVDSiO_2$ or the like is formed about 600 nm thick on the entire surface of the semiconductor substrate 10 in order to bury the trenches 15 formed around the first polycrystalline silicon film 12. The buried insulating film 17 is then planarized to the desired height by (FIG. 3F).

Thereafter, the silicon nitride film 13 is removed by wet etching, thus forming device isolation regions 17 (FIG. 3G). Then, an ONO film ($SiO_2$—SiN—$SiO_2$) 18 is deposited 12 nm thick as an inter-electrode insulating film on the entire surfaces of the first polycrystalline silicon film 12 and the buried insulating film 17. Then, a second polycrystalline silicon film 19 and a refractory metal silicide film 20 are deposited in order on the ONO film 18 (FIG. 3H).

Thereafter, to form word lines (WL), the refractory metal silicide film 20, the second polycrystalline silicon film 19, the ONO film 18 and the first polycrystalline silicon film 12 are processed in order by anisotropic dry etching. As a result, the first polycrystalline silicon film 12 and the second polycrystalline silicon film 19 respectively become the first gate electrode and the second gate electrode.

Thereafter, ion implantation is carried out to form source/drain regions in the semiconductor substrate 10 by which memory cells each comprising an MOS transistor are completed.

FIG. 4 is a plan view of the semiconductor substrate 10 on which word lines WL are formed. A plurality of device regions 22 defined by the device isolation regions (buried insulating film) 17 are formed on the semiconductor substrate 10. A plurality of MOS transistors are formed in series in each device region 22, and the adjoining transistors share source/drain regions. One of the source/drain regions is connected to a bit line BL (not shown). The gate electrode of one transistor in each device region 22 is electrically connected to the gate electrode of one transistor in an adjoining device region by the word line WL that is comprised of the refractory metal silicide film 20 and the associated second polycrystalline silicon film 19. Each word line WL is so laid as to laterally connecting the gate electrodes of the transistors that are formed in the device regions isolated by the device isolation regions 17.

Figure 5:
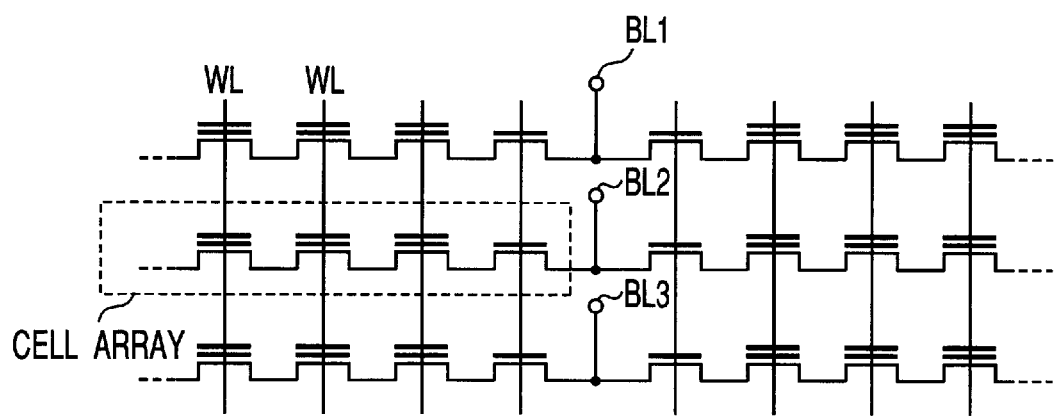
FIG. 5 is a partial circuit diagram of the memory cells of a NAND type EEPROM.

FIG. 5 is a circuit diagram of the memory cells of the above-described NAND type EEPROM. This memory cell array has a plurality of cells arranged in a matrix form. A plurality of transistors located in a broken-line block in FIG. 5 constitutes a NAND type cell array which is formed in one of the device regions. A plurality of transistors have their source or drain regions shared by adjoining transistors, and are connected in series. The source or drain region at one end of the series circuit of the transistors is connected to the associated bit line BL. Each word line WL is connected to the gate electrodes of the same column of transistors.

According to this invention, because the end portion of the floating gate (first gate electrode) is so designed as to extend over the associated device isolation region, a high electric field is not applied to the gate oxide film. The reason for this phenomenon will now be discussed in comparison with the prior art by referring to FIGS. 6A and 6B.

Figure 6A:
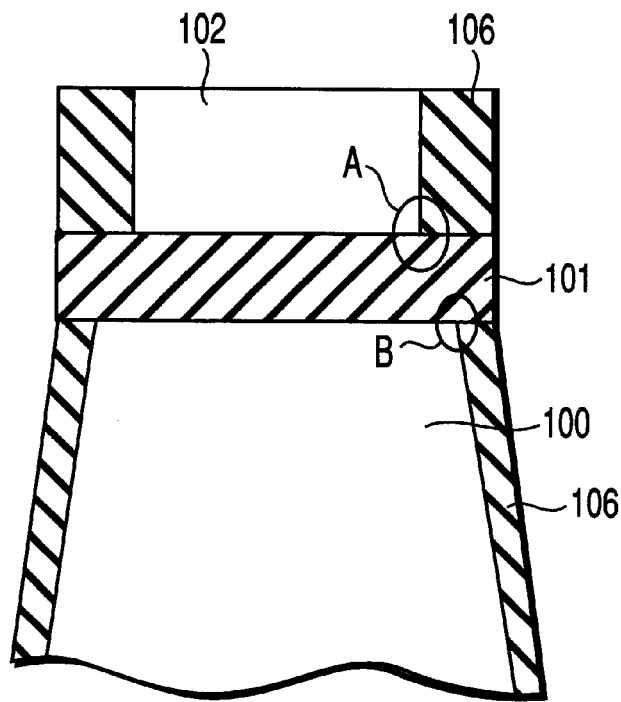
FIG. 6A is a cross-sectional view of a gate electrode portion showing the positional relationship between the widthwise edge portion of the gate of a memory cell and the edge portion of a semiconductor substrate under the gate according to the conventional fabrication method.

FIG. 6A shows the case where the conventional fabrication method is used. Because the oxidation rate of the edge A of the first conductive polycrystalline silicon film 102 which is the floating gate is faster than that of the edge B of the semiconductor substrate 100, post-RIE oxidation causes the edge A to be retreated as compared with the edge B.

Figure 6B:
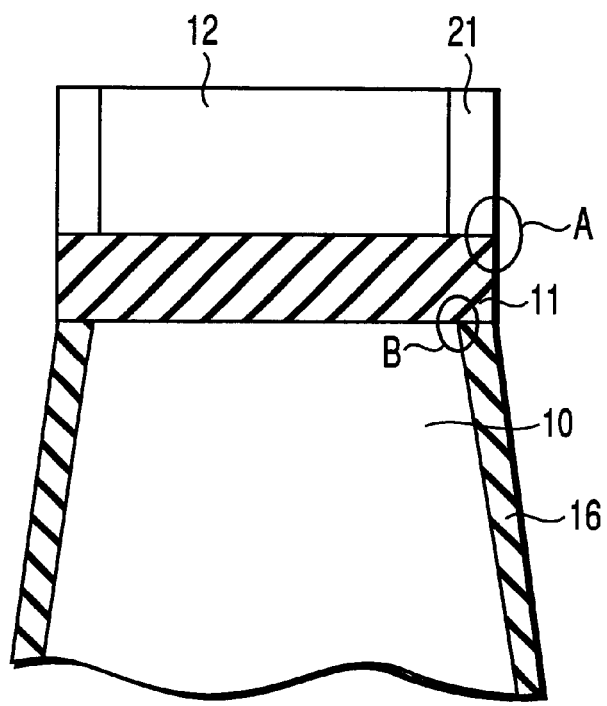
FIG. 6B is a cross-sectional view of a gate electrode portion showing the positional relationship between the widthwise edge portion of the gate of a memory cell and the edge portion of a semiconductor substrate under the gate according to the fabrication method of this invention.

By contrast, FIG. 6B shows the case where the fabrication method of this invention is used. Because the oxidation of the side portion of the first conductive polycrystalline silicon film 12 is suppressed, the edge B of the semiconductor substrate 10 is retreated as compared with the edge A of the first polycrystalline silicon film 12.

This embodiment can therefore provide the structure that prevents an electric field from concentrating on the gate edge of the first polycrystalline silicon film 12 that is equivalent to the cathode electrode in erase mode.

According to the above-described fabrication method of this invention, the charges produced in the oxide film by electric stress can be reduced by making the effective width of the semiconductor substrate 10 shorter than the effective gate width of the first polycrystalline silicon film 12. This can suppress a variation in the threshold voltage of the memory cells, and can thus provide more reliable memory cells.

Although thermal nitriding using an $NH_3$ gas is used to prevent the edge of the gate electrode from being oxidized in the first embodiment, the same advantages can be acquired by employing thermal nitriding using other gases, such as $N_2O$, N and NO.

Second Embodiment

FIGS. 7A through 7H are cross-sectional views of memory cell portions illustrating the step-by-step fabrication of an EEPROM according to a second embodiment of this invention. To avoid the redundant description, like or same reference numerals are given to those components which are the same as the corresponding components of the first embodiment.

Figure 7A:
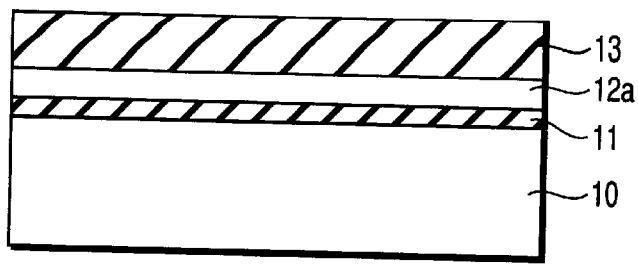
FIGS. 7A through 7H are cross-sectional views of memory cell portions illustrating the step-by-step fabrication of an EEPROM according to a second embodiment of this invention.

First, a gate oxide film (insulating film) 11 is formed 8 nm thick on the flat-finished major surface of a substrate 10 of p type silicon, and a first conductive polycrystalline silicon film 12a doped with nitrogen atoms at a predetermined ratio and having a thickness of 100 nm and a silicon nitride film 13 with a thickness of 150 nm are formed on this gate oxide film 11 (FIG. 7A).

Figure 7B:
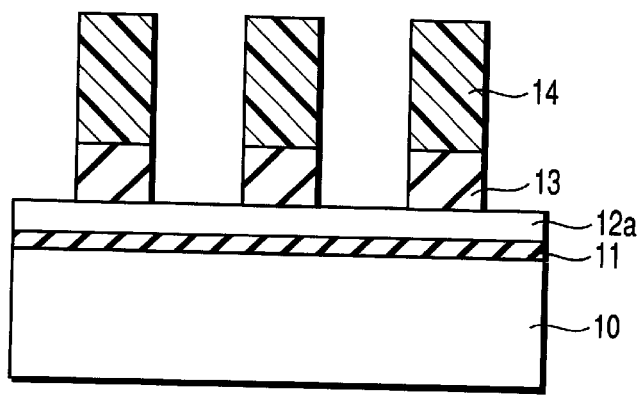

Next, a photoresist is coated on the entire surface of the silicon nitride film 13 and is then processed by photolithography, thus forming a resist pattern 14 (FIG. 7B).

Figure 7C:
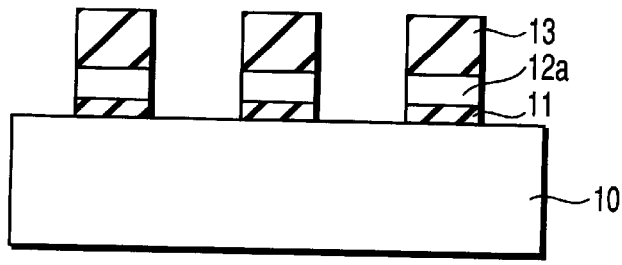

With the resist pattern 14 used as a mask, the silicon nitride film 13 is patterned to be an etching mask by anisotropic dry etching such as RIE. Then, the resist pattern 14 is removed by wet etching, and the first polycrystalline silicon film 12a and the gate oxide film 11 are processed by anisotropic dry etching such as RIE by using the patterned silicon nitride film 13 as a mask. As a result, the first polycrystalline silicon film 12a on the gate oxide film 11 becomes the nitrogen-atoms doped floating gate (first gate electrode) (FIG. 7C).

Figure 7D:
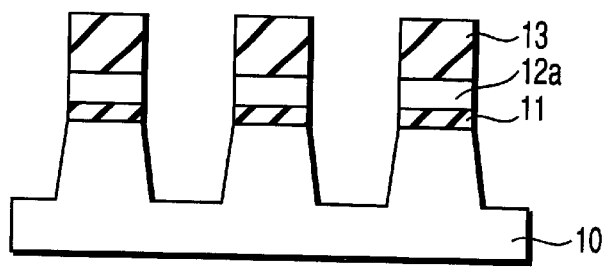

Next, the semiconductor substrate 10 is selectively etched to a desired depth by anisotropic dry etching such as RIE, thereby forming trenches, and device regions are formed in the regions that are defined by those trenches (FIG. 7D).

Figure 7E:
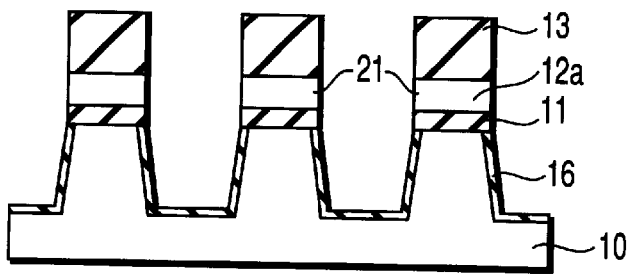

Subsequently, a post-RIE oxide film 16 is formed 10 nm thick for recovery from the damages on the etched surface of the semiconductor substrate 10 (FIG. 7E). This oxide film 16 is integrated with a device-isolation insulating film to be buried later and becomes part of the device-isolation insulating film.

Figure 7F:
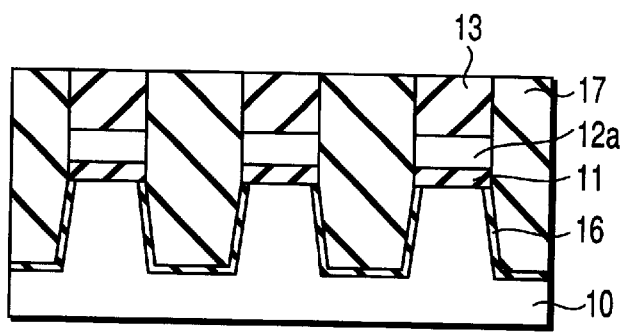
Figure 7G:
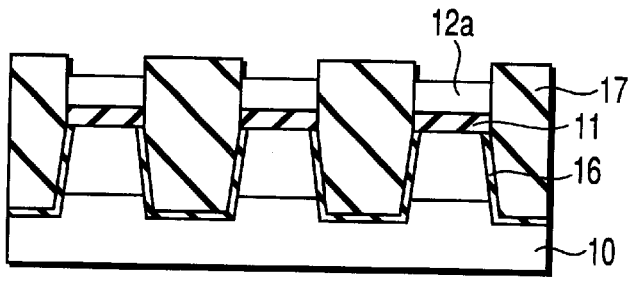

Next, a buried insulating film 17 of $CVDSiO_2$ or the like is formed 600 nm thick on the entire surface of the semiconductor substrate 10 in order to bury the trenches formed around the floating gate, and the buried insulating film 17 is then planarized to the desired height (FIG. 7F). Thereafter, the silicon nitride film 13 is removed by wet etching, thus forming device isolation regions (FIG. 7G).

Figure 7H:
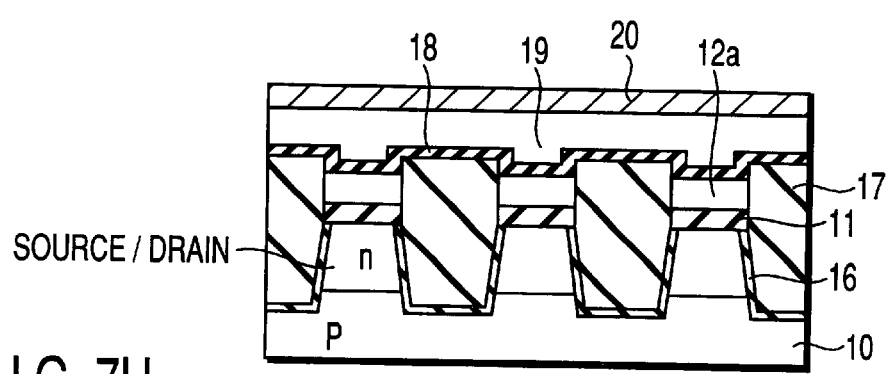

Then, an ONO film 18 is deposited 12 nm thick as an inter-electrode insulating film on the entire surfaces of the floating gate and the device isolation regions. Then, a second polycrystalline silicon film 19 having a thickness of 100 nm, which constitutes the control gate (second gate electrode), and a refractory metal silicide film 20 having a thickness of 50 nm are deposited in order on the ONO film 18 and are patterned. Then, source/drain regions are formed on the semiconductor substrate 10 (FIG. 7H).

As nitrogen atoms are doped in the control gate formed of polysilicon, even the post-RIE oxidation does not oxidize the control gate greatly, so that the widthwise end portions of the gate electrodes extend over the device isolation regions. This suppresses damages on the gate oxide film.

The proper amount of a nitrogen to be added to the polysilicon film is 3 to 5 wt % to the amount of the polysilicon film. Adding at least 3 wt % of nitrogen to the polysilicon film can remarkably reduce the oxidation speed of the polysilicon film. As the amount of nitrogen added increases, however, the conductivity is reduced, the limit of addition is 5 wt %.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a semiconductor substrate;
   a device region formed in said semiconductor substrate;
   a device isolation region formed of an insulating film in said semiconductor substrate and configured to surround and define said device region;
   a gate insulating film formed on said device region; and
   a first gate electrode formed on said gate insulating film in contact therewith, widthwise end portions of said first gate electrode extending over a part of said device isolation region, at least a part of opposing sides of said first gate electrode, at said widthwise end portions, being covered with said device isolation region, and said opposing sides of said first gate electrode being continuously and substantially vertical,
   an upper surface of said first gate electrode being formed substantially in parallel with said semiconductor substrate.

2. The semiconductor memory device according to claim 1, wherein said first gate electrode is formed of polysilicon.

3. The semiconductor memory device according to claim 1, wherein nitrogen atoms are doped in those areas of said first gate electrode which extend at least over said device isolation region.

4. The semiconductor memory device according to claim 1, wherein said first gate electrode is formed of polysilicon, and 3 to 5 wt % inclusive of nitrogen atoms are doped in those areas of said first gate electrode which extend at least over said device isolation region.

5. The semiconductor memory device according to claim 1, wherein nitrogen atoms are doped in said first gate electrode almost evenly.

6. The semiconductor memory device according to claim 1, wherein said first gate electrode is formed of polysilicon in which 3 to 5 wt % inclusive of nitrogen atoms are doped almost evenly.

7. The semiconductor memory device according to claim 1, further comprising a second gate electrode formed on said first gate electrode via an inter-electrode insulating film.

8. The semiconductor memory device according to claim 1, said upper surface of said first gate electrode is substantially perpendicular to a side of said first gate electrode.

9. A semiconductor memory device comprising:

a semiconductor substrate;

a device region formed in said semiconductor substrate;

a device isolation region formed of an insulating film in said semiconductor substrate, and configured to surround and define said device region;

a gate insulating film formed on said device region; and a first gate electrode formed on said gate insulating film in contact therewith, widthwise end portions of said first gate electrode extending over a part of said device isolation region, at least a part of opposing sides of said first gate electrode, at said widthwise end portions being covered with said device isolation region, and said opposing sides of said first gate electrode being continuously and substantially vertical and a width of said first gate electrode between said opposing sides being greater than a channel width on said device region.

10. The semiconductor memory device according to claim 9, wherein said gate insulating film extends onto a portion of said device isolation region.

11. The semiconductor memory device according to claim 9, wherein said device isolation region comprises a first insulating film buried in a trench in said semiconductor substrate and a second insulating film formed by oxidizing a side of said trench in said semiconductor substrate.

12. The semiconductor memory device according to claim 11, wherein said widthwise end portions of said first gate electrode are located above said second insulating film.

13. The semiconductor memory device according to claim 9, wherein said first gate electrode is formed of polysilicon.

14. The semiconductor memory device according to claim 9, wherein nitrogen atoms are doped in the widthwise end portions of said first gate electrode which extend over said device isolation region.

15. The semiconductor memory device according to claim 9, wherein said first gate electrode is formed of polysilicon, and 3 to 5 wt % inclusive of nitrogen atoms are doped in the widthwise end portions of said first gate electrode which extend over said device isolation region.

16. The semiconductor memory device according to claim 9, wherein nitrogen atoms are doped in said first gate electrode substantially evenly.

17. The semiconductor memory device according to claim 9, wherein said first gate electrode is formed of polysilicon in which 3 to 5 wt % inclusive of nitrogen atoms are doped substantially evenly.

18. The semiconductor memory device according to claim 9, further comprising a second gate electrode formed on said first gate electrode via an inter electrode insulating film.

19. The semiconductor memory device according to claim 9, wherein an upper surface of said first gate electrode is formed parallel to said semiconductor substrate.

20. The semiconductor memory device according to claim 19, wherein said upper surface of said first gate electrode is substantially perpendicular to a side of said first gate electrode.

* * * * *